United States Patent
Kim et al.

(10) Patent No.: US 9,159,839 B2
(45) Date of Patent: Oct. 13, 2015

(54) THIN FILM TRANSISTOR ARRAY PANEL AND MANUFACTURING METHOD THEREOF

(71) Applicant: Samsung Display Co., Ltd., Yongin (KR)

(72) Inventors: Gun Hee Kim, Hwaseong-si (KR); Jin Hyun Park, Yongin-si (KR); Kyoung Won Lee, Gwangmyeong-si (KR); Byung Du Ahn, Hwaseong-si (KR); Jee-Hun Lim, Seongnam-si (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/180,171

(22) Filed: Feb. 13, 2014

(65) Prior Publication Data
US 2014/0291665 A1      Oct. 2, 2014

(30) Foreign Application Priority Data
Mar. 28, 2013   (KR) ........................ 10-2013-0033871

(51) Int. Cl.
*H01L 29/786*   (2006.01)
*H01L 27/12*   (2006.01)

(52) U.S. Cl.
CPC ........ *H01L 29/7869* (2013.01); *H01L 27/1225* (2013.01); *H01L 27/1288* (2013.01)

(58) Field of Classification Search
CPC ............ H01L 29/7869; H01L 29/4908; H01L 27/1225; H01L 29/41733; H01L 29/786; H01L 29/42384
USPC .................................................... 257/43, 72
See application file for complete search history.

(56) References Cited

U.S. PATENT DOCUMENTS

| | | | |
|---|---|---|---|
| 8,586,979 B2* | 11/2013 | Son et al. ........................ | 257/43 |
| 2006/0086976 A1* | 4/2006 | Mardilovich et al. ......... | 257/347 |
| 2006/0088962 A1* | 4/2006 | Herman et al. ............... | 438/151 |

(Continued)

FOREIGN PATENT DOCUMENTS

| | | |
|---|---|---|
| JP | 2006-195077 | 7/2006 |
| JP | 2007-073312 | 3/2007 |
| KR | 10-2006-0023697 | 3/2006 |
| KR | 10-2008-0095956 | 10/2008 |

(Continued)

OTHER PUBLICATIONS

Michael Kohler, Etching in Microsystem Technology, Jul. 11, 2008, pp. 181-344, Wiley-VCH, Weinheim, Germany.

*Primary Examiner* — Minh-Loan Tran
(74) *Attorney, Agent, or Firm* — H.C. Park & Associates, PLC

(57) ABSTRACT

A thin film transistor array panel includes: a gate electrode disposed on a substrate, an insulating layer disposed on the gate electrode, an oxide semiconductor disposed on the gate insulating layer, source electrode overlapping a portion of the oxide semiconductor, a drain electrode overlapping another portion of the oxide semiconductor; and a buffer layer disposed between the oxide semiconductor and the source electrode and between the oxide semiconductor and the drain electrode. The buffer layer comprises tin as a doping material. A weight percent of the doping material is greater than approximately 0% and less than or equal to approximately 20%.

43 Claims, 19 Drawing Sheets

(56) References Cited

U.S. PATENT DOCUMENTS

| | | |
|---|---|---|
| 2008/0206923 A1 | 8/2008 | Kim et al. |
| 2010/0051936 A1 | 3/2010 | Hayashi et al. |
| 2011/0062485 A1 | 3/2011 | Nakayama et al. |
| 2011/0143511 A1 | 6/2011 | Wang et al. |
| 2011/0159658 A1 | 6/2011 | Hsiao et al. |
| 2013/0037798 A1* | 2/2013 | Wong et al. .................... 257/43 |

FOREIGN PATENT DOCUMENTS

| | | |
|---|---|---|
| KR | 10-2010-0057243 | 5/2010 |
| KR | 10-2010-0079310 | 7/2010 |
| KR | 10-2011-0051799 | 5/2011 |
| KR | 10-2011-0109885 | 10/2011 |
| KR | 10-2012-0138074 | 12/2012 |

* cited by examiner

THIN FILM TRANSISTOR ARRAY PANEL AND MANUFACTURING METHOD THEREOF

CROSS-REFERENCE TO RELATED APPLICATION

This application claims priority from and the benefit of Korean Patent Application No. 10-2013-0033871, filed on Mar. 28, 2013, which is incorporated by reference for all purposes as if set forth herein.

BACKGROUND

1. Field

Exemplary embodiments relate to display technology, and, more particularly, to a thin film transistor array panel and a manufacturing method thereof.

2. Discussion

Conventional liquid crystal displays typically include two display panels with electrodes and a liquid crystal layer disposed between the two display panels. In this manner, voltage may be applied to the electrodes to rearrange the liquid crystal molecules of the liquid crystal layer to control the amount of transmitted light through the liquid crystal layer to facilitate the display of images.

A thin film transistor (TFT) array panel is typically utilized as one of two array panels utilized in a liquid crystal display. To this end, the TFT array panel may be used as a circuit board to independently drive each pixel in the liquid crystal display. It is noted that TFT array panels may be used in association with various flat panel displays, such as liquid crystal displays (LCDs), organic light emitting diode (OLED) displays, plasma displays (PDs), electroluminescent (EL) displays, electrophoretic displays (EPDs), electrowetting displays (EWDs), and the like.

Typical TFT array panels usually have scanning signal lines (or gate lines) to transfer scanning signals, and image signal lines (or data lines) to transfer image signals. To this end, conventional TFT array panels usually include thin film transistors connected to the gate lines and the data lines, pixel electrodes connected to the thin film transistors, a gate insulating layer covering and insulating the gate lines, and an interlayer insulating layer covering and insulating the thin film transistors and the data lines.

When used in association with flat panel displays, a TFT array panel may include a plurality of TFTs, which may include various different types of semiconductor materials. For instance, when an oxide semiconductor is used as a semiconductor material included in a TFT, metallic components of a metal layer, including a source electrode and a drain electrode, may spread to the oxide semiconductor layer. In this manner, a channel layer formed by the oxide semiconductor layer may be degraded. To prevent the degradation of the channel layer, a buffer layer including an oxide may be formed below the metal layer including the source electrode and the drain electrode. However, when the metal layer including the source electrode and the drain electrode, and the buffer layer disposed therebelow are formed, a difference in etching rates may occur with respect to an etching solution and the various aforementioned components. When an etching rate of the buffer layer is high, the buffer layer below the source electrode and the drain electrode may be over-etched. When the buffer layer is over-etched, the source electrode and the drain electrode may be electrically floated. To this end, the thin film transistor may be degraded.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide a thin film transistor array panel and a manufacturing method thereof to prevent (or otherwise reduce) the potential for thin film transistors from being degraded by reducing differences in etching rates between source electrodes and drain electrodes, and buffer layers disposed therebelow. To this end, exemplary embodiments also facilitate the prevention of a metal layer including a source electrode and a drain electrode from spreading (or otherwise migrating) to a channel layer when an oxide semiconductor is used as part of the thin film transistor.

According to exemplary embodiments, a thin film transistor array panel, includes: a gate electrode disposed on a substrate; an oxide semiconductor disposed on the substrate and overlapping the gate electrode; an insulating layer disposed between the gate electrode and the oxide semiconductor; a source electrode overlapping a portion of the oxide semiconductor; a drain electrode overlapping another portion of the oxide semiconductor; and a buffer layer disposed between the oxide semiconductor and the source electrode and between the oxide semiconductor and the drain electrode. The buffer layer includes tin as a doping material. A weight percent of the doping material is greater than approximately 0% and less than or equal to approximately 20%.

According to exemplary embodiments, a method of manufacturing a thin film transistor array panel, includes: forming a gate electrode on a substrate; forming an insulating layer on the gate electrode; and forming an oxide semiconductor, a buffer layer, a source electrode, and a drain electrode on the gate insulating layer. Forming of the oxide semiconductor, the buffer layer, the source electrode, and the drain electrode includes: depositing an oxide semiconductor layer on the insulating layer, depositing a blocking film on the oxide semiconductor layer, depositing a metal layer on the blocking film, forming a first photosensitive film pattern including different thicknesses on the metal layer, etching, using the first photosensitive film pattern as a first mask, the metal layer, the blocking film, and the semiconductor layer using a first etching solution, forming a second photosensitive film pattern from the first photosensitive film pattern, and etching, using the second photosensitive film pattern as a second mask, the etched metal layer and the etched blocking film using a second etching solution to form the source electrode, the drain electrode, and the buffer layer, and to expose a channel region of the oxide semiconductor. The buffer layer includes tin as a doping material. A weight percent of the doping material is greater than approximately 0% and less than or equal to approximately 20%.

According to exemplary embodiments, an oxide semiconductor may be used in a thin film transistor, such that a metal layer including a source electrode and a drain electrode may be prevented (or otherwise reduced) from spreading to a channel layer. To this end, the source electrode and the drain electrode may be prevented (or otherwise reduced) from being floated by reducing differences in etching rates between the source electrode and the drain electrode, and a buffer layer disposed therebelow. In this manner, exemplary embodiments facilitate the prevention (or otherwise reduction) in thin film transistor degradation.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
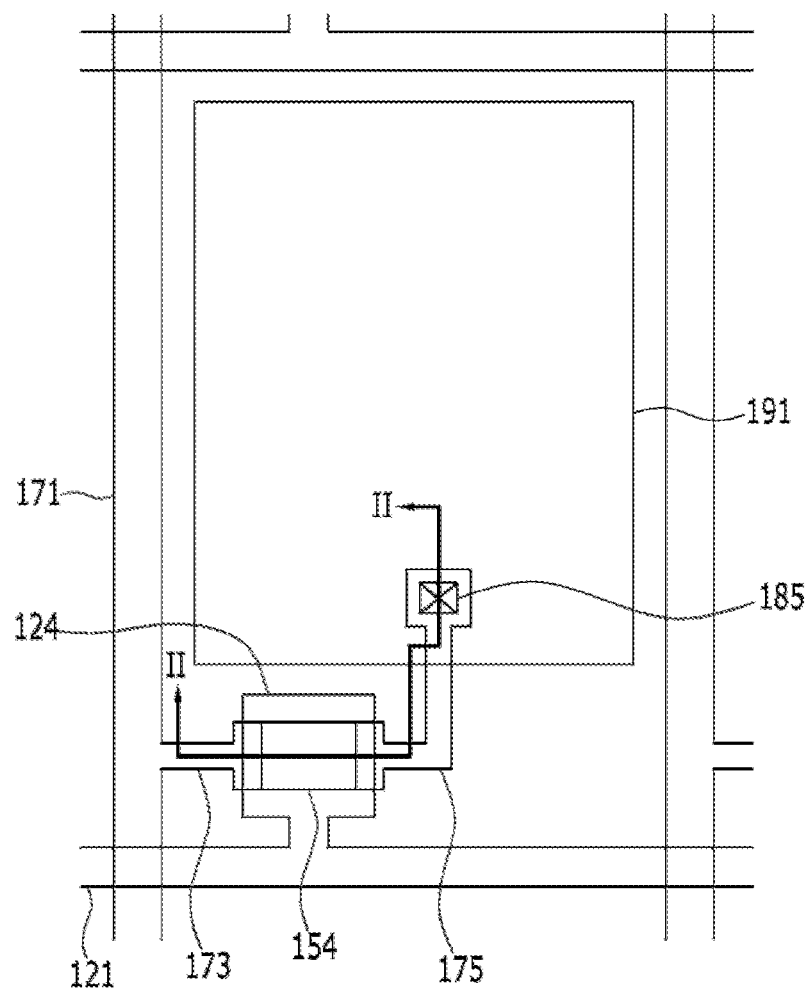
FIG. 1 is a layout view of a pixel of a thin film transistor array panel, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper," and/or the like, may be used herein for descriptive purposes, and thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

While exemplary embodiments are described in association with liquid crystal display devices, it is contemplated that exemplary embodiments may be utilized in association with other or equivalent display devices, such as various self-emissive and/or non-self-emissive display technologies. For instance, self-emissive display devices may include organic light emitting displays (OLED), plasma display panels (PDP), etc., whereas non-self-emissive display devices may include electrophoretic displays (EPD), electrowetting displays (EWD), etc.

Figure 2:
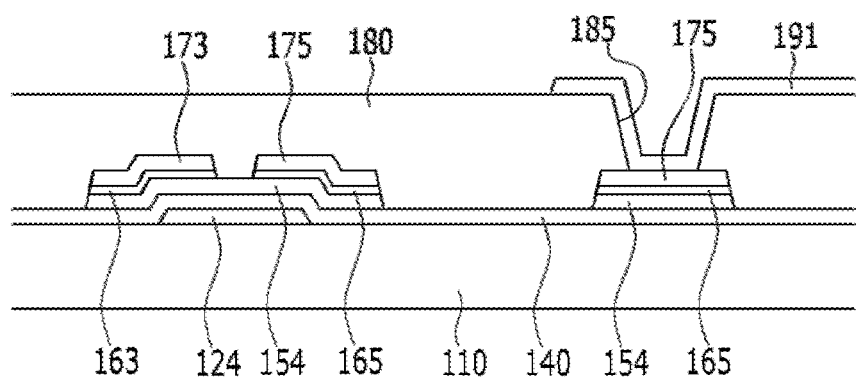
FIG. 2 is a cross-sectional view of the thin film transistor array panel of FIG. 1 taken along sectional line II-II, according to exemplary embodiments.

FIG. 1 is a layout view of a pixel of a thin film transistor array panel, according to exemplary embodiments. FIG. 2 is a cross-sectional view of the thin film transistor array panel of FIG. 1 taken along sectional line II-II.

Referring to FIGS. 1 and 2, a gate line 121 is formed on an insulation substrate 110 made of any suitable material, such as, for example, transparent glass, plastic, etc. The gate line 121 transfers a gate signal and extends substantially in a first (e.g., horizontal) direction. The gate line 121 includes a plurality of gate electrodes 124 that protrude from the gate line 121 and a gate pad portion (not illustrated) having an extended area for connection with another layer or driving circuit, such as an external driving circuit.

A gate insulating layer 140, which may be formed from any suitable insulator, such as, for instance, silicon nitride (SiNx), silicon oxide (SiOx), etc., is formed on the gate line 121. A semiconductor 154 is formed on the gate insulating layer 140.

According to exemplary embodiments, the semiconductor 154 may be an oxide semiconductor. In this manner, a semiconductor layer 154 may include any suitable oxide-based material, such as, for instance, an oxide based on zinc (Zn), gallium (Ga), tin (Sn), and/or indium (In). For instance, the semiconductor layer 154 may include zinc oxide (ZnO), indium-gallium-zinc oxide (InGaZnO$_4$), indium-zinc-oxide (Zn—In-Oxide), zinc-tin oxide (Zn—Sn-Oxide), etc. In this manner, the semiconductor 154 including the oxide material may be formed via any suitable process(es), such as, for example, a solution-based process, e.g., an inkjet process, and/or the like. As other examples, the semiconductor 154 may be an oxide semiconductor, such as a gallium indium zinc oxide (GIZO) semiconductor, zinc tin oxide (ZTO or ZnSnO) semiconductor, indium zinc oxide (IZO or InZnO) semiconductor, indium zinc tin oxide (IZTO or InZnSnO), and/or the like.

Although not illustrated, a thin film transistor array panel, according to exemplary embodiments, if the semiconductor 154 is a gallium indium zinc oxide (GIZO) semiconductor including indium (In), the semiconductor 154 may be a multilayer (e.g., dual-layer) structure including a lower layer of a gallium indium zinc oxide (GIZO) having a comparatively higher content of indium (In) and an upper layer of a gallium indium zinc oxide (GIZO) having a relatively lower content of indium (In). As such, a GIZO layer having a comparatively lower indium (In) content may be disposed as the upper layer to, thereby, reduce generation of an indium (In) surface protrusion, which may occur during one or more manufacturing processes.

Further, although not illustrated, the thin film transistor array panel, according to exemplary embodiments, may include an upper surface subjected to fluorination or any other suitable chemical introduction process. In this manner, the upper surface of the semiconductor 154 may be subjected to fluorination to, thereby, reduce the generation of indium (In) surface protrusions, which may occur during one or more manufacturing processes.

Buffer layers 163 and 165 are formed on the semiconductor 154. In exemplary embodiments, the buffer layers 163 and 165 may be formed of any suitable material, such as, for instance, gallium zinc oxide (GZO) doped with tin (Sn) or tin oxide (SnOx, where X=1 to 2). In this manner, a weight percent of tin (Sn) or tin oxide (SnOx, where X=1 to 2) in the buffer layers 163 and 165 may be more than approximately 0% and equal to or less than approximately 20%.

According to exemplary embodiments, the data line 171, the source electrode 173, and the drain electrode 175 are formed on the buffer layers 163 and 165. Edges of the buffer layers 163 and 165 may be substantially the same as the edges of the data line 171, the source electrode 173, and the drain electrode 175 in a plan view. In this manner, an undercut may not occur at the edges of the buffer layers 163 and 165 as compared to the edges of the data line 171, the source electrode 173, and the drain electrode 175.

The data line 171 transfers a data signal and extends substantially in a second (e.g., vertical) direction to cross the gate line 121. The data line 171 includes source electrodes 173, which extend toward the gate electrode 124 and a data pad portion (not illustrated) having an area for connection with another layer, a driving circuit (e.g., external driving circuit), etc. The drain electrode 175 may be separated (or otherwise spaced apart) from the data line 171, and, thereby, faces the source electrode 173 with respect to the gate electrode 124. In exemplary embodiments, the data line 171, the source electrode 173, and the drain electrode 175 may be formed from any suitable material, such as a low-resistance metal, e.g., copper (Cu), etc.

According to exemplary embodiments, the buffer layers 163 and 165 may improve contact characteristics between the semiconductor 154 (which may be made of an oxide-based material) and the data line 171, the source electrode 173, and the drain electrode 175, as well as configured to prevent (or otherwise reduce) a metallic component from the data line 171, the source electrode 173, and/or the drain electrode 175 from spreading (or otherwise migrating) to the semiconductor 154.

According to exemplary embodiments, the buffer layers 163 and 165 may include gallium zinc oxide doped with tin (Sn) or tin oxide (SnOx; X=1-2), and the gallium zinc oxide (GZO), and the weight percent of tin (Sn) or tin oxide (SnOx; X=1-2) in the buffer layers 163 and 165 may be more than approximately 0% and equal to or less than approximately 20%. In this manner, over-etching of the buffer layers 163 and 165 may be prevented (or otherwise reduced). Further, exemplary embodiments enable to the prevention of the data line 171, the source electrode 173, and/or the drain electrode 175 from being floated due to over-etching of the buffer layers 163 and 165.

Although not illustrated, the data line 171, the source electrode 173, and/or the drain electrode 175 may include a lower layer including copper (Cu) and an upper layer including copper (Cu) and manganese (Mn). However, the data line 171, the source electrode 173, and/or the drain electrode 175 may be made of (or otherwise include) any suitable material, such as any suitable metal of various other "low" specific resistance.

As seen in FIGS. 1 and 2, one gate electrode 124, one source electrode 173, and one drain electrode 175 form one thin film transistor (TFT) together with one semiconductor 154. In this manner, a channel of the thin film transistor is formed on the semiconductor 154 between the source electrode 173 and the drain electrode 175.

According to exemplary embodiments, a passivation layer 180 may be formed on the data line 171 and the drain electrode 175. The passivation layer 180 may be made of (or otherwise include) any suitable insulation material, such as, for instance, an inorganic insulator, e.g., silicon nitride, silicon oxide, etc., an organic insulator, and/or a low-dielectric insulator. A contact hole (or via) 185 exposing the drain electrode 175 is formed in the passivation layer 180.

In exemplary embodiments, a pixel electrode 191 is formed on the passivation layer 180. The pixel electrode 191 is physically and electrically connected to the drain electrode 175 through the contact hole 185. In this manner, the pixel electrode may be supplied with data voltage from, for instance, the drain electrode 175. The pixel electrode 191 applied with the data voltage generates an electric field together with, for instance, a common electrode (not illustrated) supplied with a common voltage. In this manner, the electric field may be utilized to control (or otherwise dictate) the direction of liquid crystal molecules in a liquid crystal layer (not illustrated) disposed, for example, between the pixel electrode 191 and the common electrode. The pixel electrode 191 and the common electrode constitute a capacitor (hereinafter, referred to as a "liquid crystal capacitor"), which holds the applied voltage after the thin film transistor is "turned off."

Although not illustrated, the pixel electrode 191 may overlap with a storage electrode line to form a storage capacitor. In this manner, the voltage holding capability of the liquid crystal capacitor may be reinforced (or otherwise increased).

According to exemplary embodiments, the pixel electrode 191 may be made of (or otherwise include) any suitable conductive material, such as, for instance, a transparent conductor, e.g., aluminum zinc oxide (AZO), gallium zinc oxide (GZO), indium tin oxide (ITO), indium zinc oxide (IZO), etc. It is also contemplated that one or more conductive polymers (ICP) may be utilized, such as, for example, polyaniline, poly(3,4-ethylenedioxythiophene) poly(styrenesulfonate) (PEDOT:PSS), etc.

An exemplary method to manufacture the thin film transistor array panel of FIGS. 1 and 2 will now be described in association with FIGS. 1-9.

Figure 3:
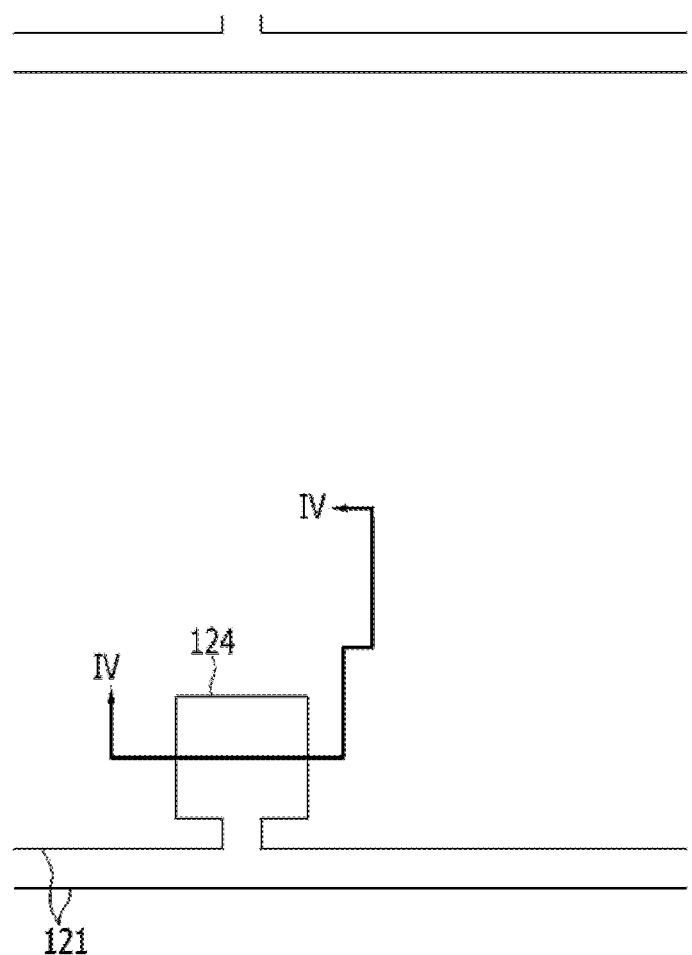
FIGS. 3, 5, and 8 are layout views of a thin film transistor array panel at various manufacturing stages, according to exemplary embodiments.
Figure 4:
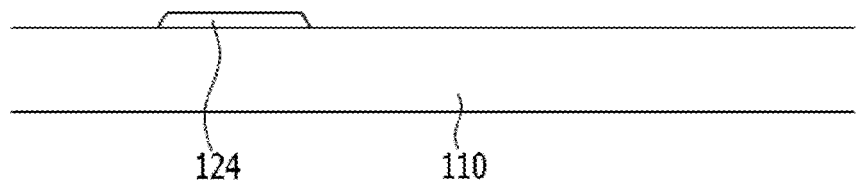
FIG. 4 is a cross-sectional view of the thin film transistor array panel of FIG. 3 taken along sectional line IV-IV, according to exemplary embodiments.
Figure 5:
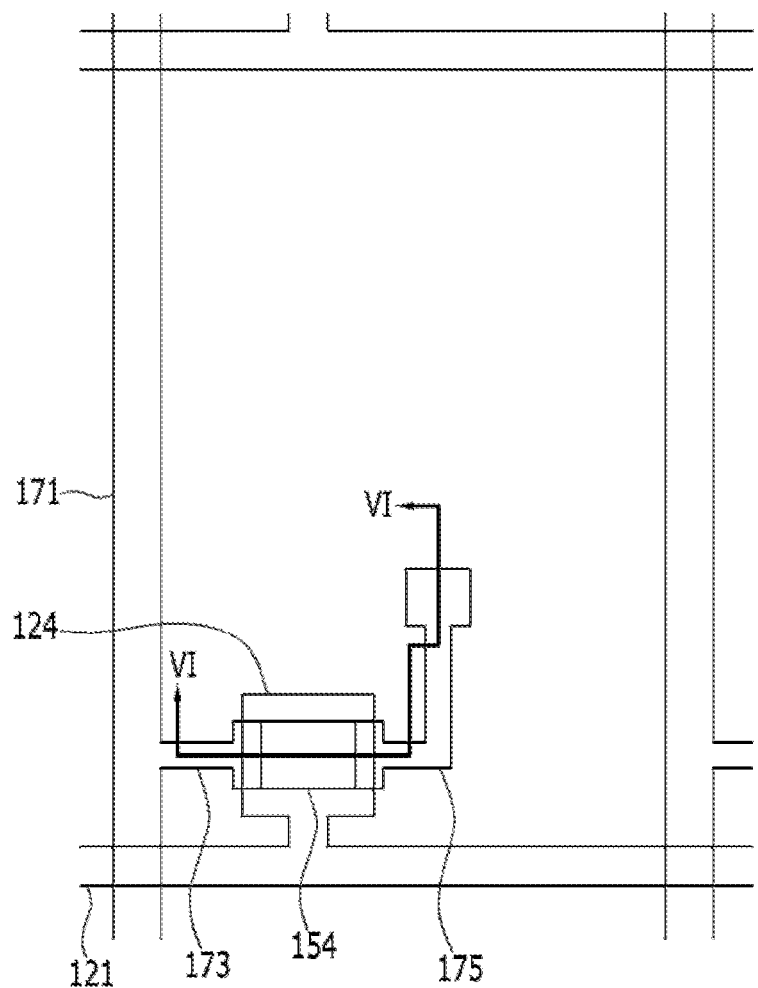
Figure 6:
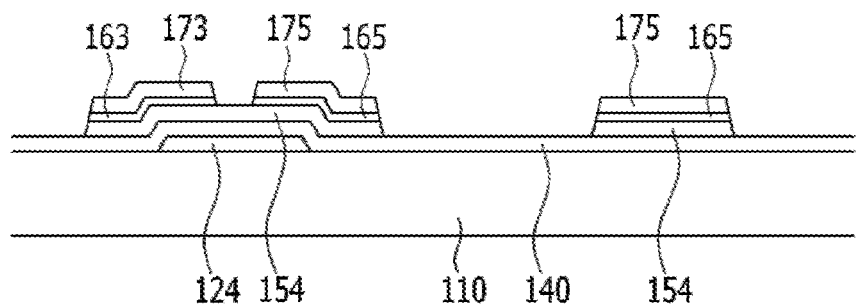
FIG. 6 is a cross-sectional view of the thin film transistor array panel of FIG. 5 taken along sectional line VI-VI, according to exemplary embodiments.
Figure 7A:
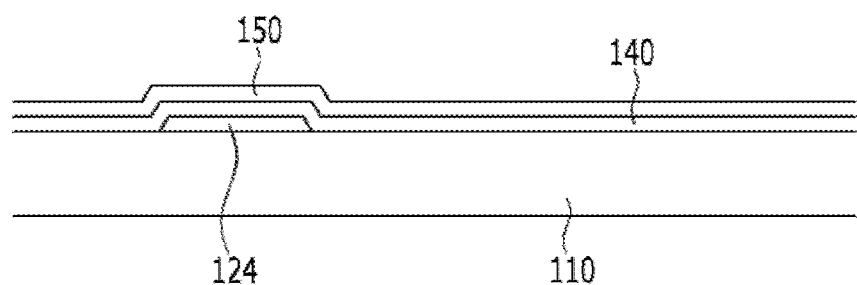
FIGS. 7A-7F are cross-sectional views of a thin film transistor array panel at various manufacturing stages, according to exemplary embodiments.
Figure 7B:
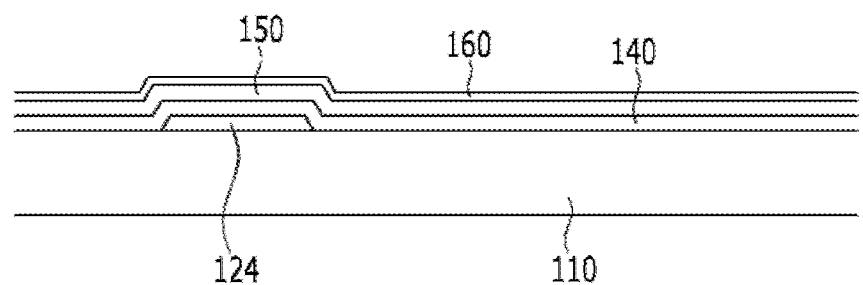
Figure 7C:
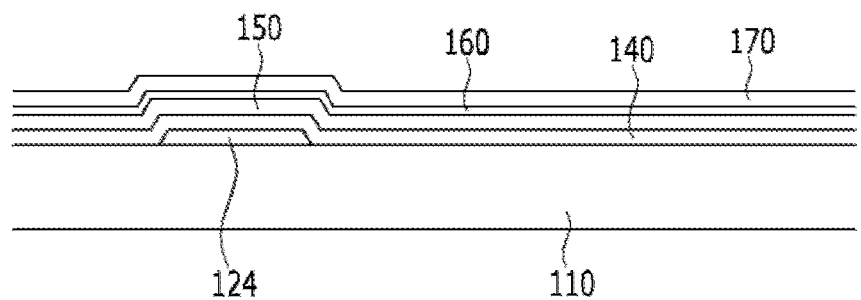
Figure 7D:
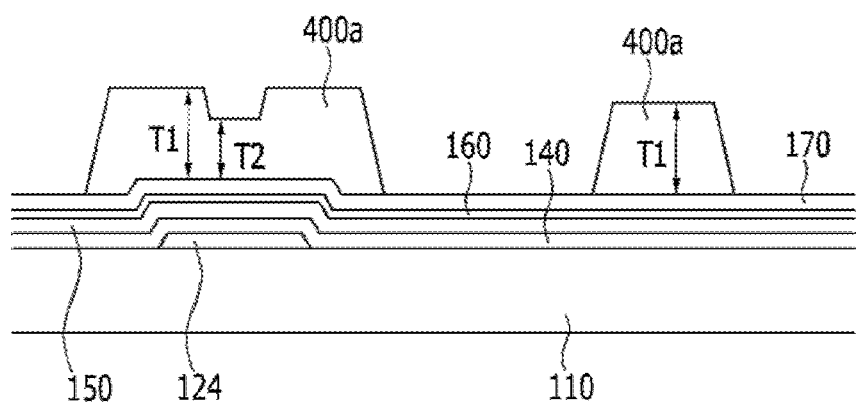
Figure 7E:
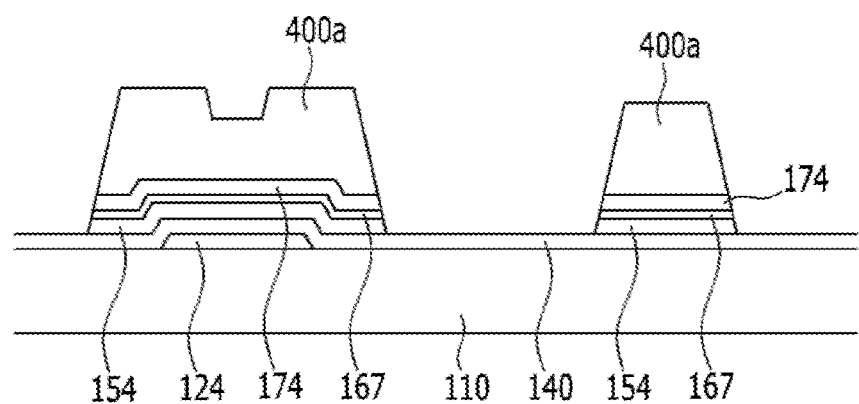
Figure 7F:
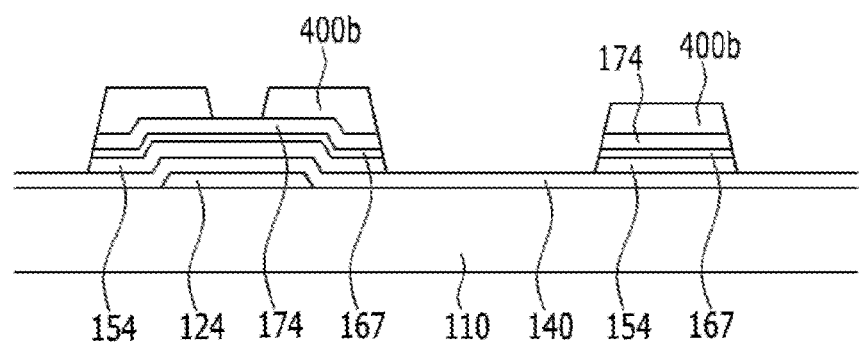
Figure 8:
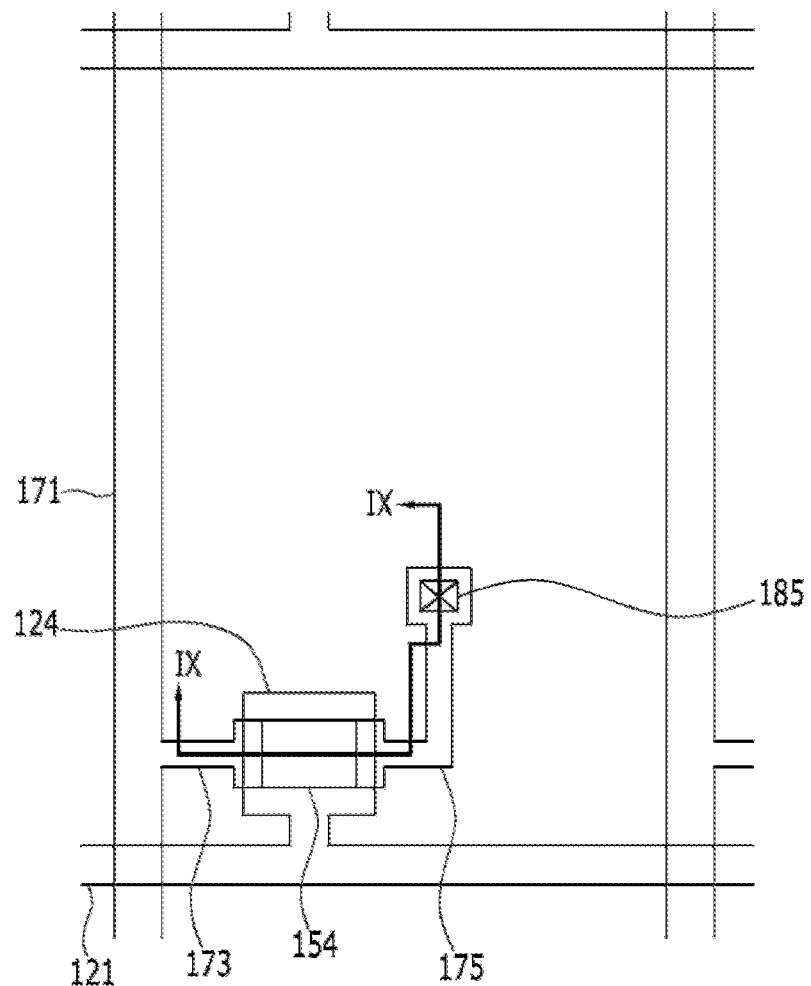
Figure 9:
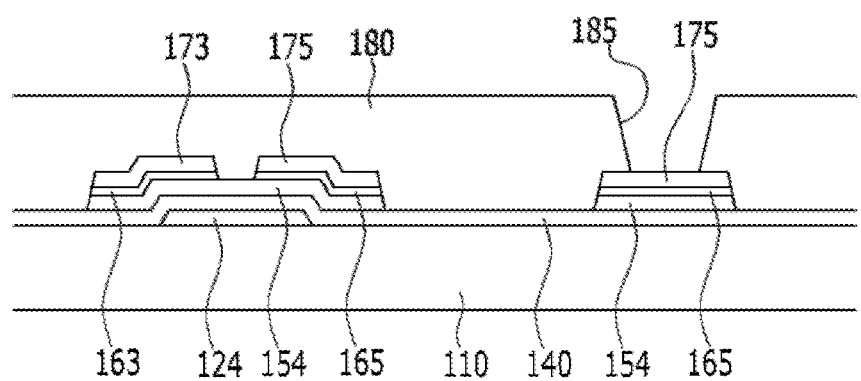
FIG. 9 is a cross-sectional view of the thin film transistor array panel of FIG. 8 taken along sectional line IX-IX, according to exemplary embodiments.

FIGS. 3, 5, and 8 are layout views of a thin film transistor array panel at various manufacturing stages, according to exemplary embodiments. FIG. 4 is a cross-sectional view of the thin film transistor array panel of FIG. 3 taken along sectional line IV-IV. FIG. 6 is a cross-sectional view of the thin film transistor array panel of FIG. 5 taken along sectional line VI-VI. FIGS. 7A-7F are cross-sectional views of a thin film transistor array panel at various manufacturing stages, according to exemplary embodiments. FIG. 9 is a cross-sectional view of the thin film transistor array panel of FIG. 8 taken along sectional line IX-IX.

As illustrated in FIGS. 3 and 4, a metal layer is deposited and patterned on the insulation substrate 110, which may be made of transparent glass, plastic, etc., to form the gate line 121 having the gate electrode 124.

As seen in FIGS. 5 and 6, the gate insulating layer 140, the semiconductor layer 154, the buffer layers 163 and 165, the data line 171, the source electrode 173, and the drain electrode 175 are formed. The formation of these components is described in more detail in association with FIGS. 7A-7F.

As illustrated in FIGS. 7A-7C, the gate insulating layer 140, a semiconductor film 150, a blocking film 160, and a metal film 170 are sequentially deposited on the gate electrode 124 and the insulation substrate 110. To this end, the gate insulating layer 140 may include nitride silicon (SiNx), oxide silicon (SiOx), etc., whereas the semiconductor film 150 may include an oxide-based material, such as, for example, gallium indium zinc oxide (GIZO), zinc tin oxide (ZTO), indium zinc oxide (IZO), indium zinc tin oxide (IZTO) and/or the like. The blocking film 160 may include gallium zinc oxide (GZO) doped with tin (Sn) or tin oxide (SnOx, where X=1 to 2) and a weight percent of tin (Sn) or tin oxide (SnOx, where X=1 to 2) in the blocking film 160 may be more than approximately 0% and equal to or less than approximately 20%. The metal film 170 may include a multilayer structure, such as, for example, include a lower layer including copper (Cu) and an upper layer including copper (Cu) and manganese (Mn). It is contemplated, however, that the metal film 170 may include any suitable metal having any suitable relatively low specific resistance.

According to exemplary embodiments, the semiconductor film 150 includes an oxide-based material and may be deposited via any suitable process, such as by vacuum evaporation. Additionally or alternatively, the semiconductor film 150 may include a solution type oxide-based material that may be applied and stacked.

Although not illustrated, the semiconductor film 150 may be a multilayer structure (e.g., a dual-layer structure) including a lower layer made of, for instance, gallium indium zinc oxide (GIZO) having a comparatively higher indium (In) content and an upper layer made of, for example, gallium indium zinc oxide (GIZO) having a comparatively lower indium (In) content. Further, although not illustrated, the semiconductor film 150 may be deposited, and, thereafter, an upper surface of the semiconductor film 150 may be subjected to, for instance, fluorination.

As illustrated in FIG. 7D, a photosensitive film is deposited onto the metal film 170 and exposed and developed to form a first photosensitive film pattern 400a having different thicknesses. In this manner, the first photosensitive film pattern 400a has a first thickness T1 in a portion corresponding to a wire part (or portion) and a second thickness T2 in a portion corresponding to a channel part (or portion). The first thickness T1 is larger than the second thickness T2, and the photosensitive film corresponding to a remaining portion except the wire part and the channel part is removed. In this manner, a ratio between the first thickness T1 of the first photosensitive film pattern 400a disposed at a portion corresponding to the wire part and the second thickness T2 of the first photosensitive film pattern 400a disposed at a portion corresponding to the channel part may be varied depending on a process condition associated with an etching process, which is described in more detail in the proceeding paragraphs. It is contemplated that the second thickness T2 of the first photosensitive film pattern 400a disposed at a portion corresponding to the channel part may be ½ or less thick than the first thickness T1 of the first photosensitive film pattern 400a disposed at a portion corresponding to the wire part.

According to exemplary embodiments, any suitable method of making the thicknesses of the first photosensitive film pattern 400a different according to the position may be utilized. For instance, an exposure mask (not shown) may be utilized to develop the first photosensitive film pattern 400a, where the exposure mask includes a semi-transparent area, a transparent area, and a light blocking area. In this manner, the various areas may be utilized to control the extent of development of the first photosensitive film pattern 400a, and, thereby, the various thicknesses of the first photosensitive film pattern 400a in the various aforementioned regions/portions. In exemplary embodiments, a slit pattern, a lattice pattern, or a thin film having medium transmittance or having a medium thickness may be provided in the semi-transparent area of the exposure mask to control the extent of development of the photosensitive film. When the slit pattern is used, the width of a slit or an interval between slits may be smaller than the resolution of an exposure device used in an associated photolithographic process. As another example, a photosensitive film in which reflow is enabled may be utilized to obtain the various thicknesses. That is, an initial photosensitive film pattern (not shown), in which reflow is enabled using a general exposure mask including only a transparent area and a blocking area, may be fabricated. In this manner, the initial photosensitive film pattern may be reflowed to allow at least some of the photosensitive film to flow to an area in which the photosensitive film is not left to, thereby, form a thinner part, and, thereby, the first photosensitive film pattern 400a. In other words, the portion of the photosensitive film that flows to fabricate the aforementioned thinner part may correspond to the portion of the first photosensitive film pattern 400a having the second thickness T2. As previously mentioned, it is contemplated that any suitable fabrication process may be utilized to generate the first photosensitive film pattern 400a of the various thickness, e.g., the first thickness T1 and the second thickness T2.

As illustrated in FIG. 7E, the exposed portions of the metal film 170, the blocking film 160, and the semiconductor film 150 are etched using the first photosensitive film pattern 400a as a mask to form a first metal pattern 174, a blocking pattern 167, and the semiconductor layer 154. In this manner, a first etching solution may be used, and the first etching solution may simultaneously etch through the metal film 170 including, for example, copper or copper and manganese, the blocking film 160 including, for instance, the gallium zinc oxide (GZO) doped with tin (Sn) or tin oxide (SnOx, where X=1 to 2), and the oxide semiconductor film 150, such as an indium-gallium-zinc oxide (IGZO) semiconductor film 150. The first etching solution may include any suitable etching solution, such as, for example, hydrofluoride and ammonium fluoride (NH$_4$F), etc.

When a ratio of a component of tin (Sn) in the blocking film 160 is relatively high, for example, approximately 70% or more, the blocking film 160 may not be etched by the first etching solution. It is noted, however, that in the thin film transistor array panel according to exemplary embodiments, since the weight percent of tin (Sn) or tin oxide (SnOx, where X=1 to 2) in the blocking film 160 may be more than approximately 0% and equal to or less than approximately 20%, the blocking film 160 may be etched by the first etching solution.

Referring to FIG. 7F, the first photosensitive film pattern 400a disposed at a portion corresponding to the channel part is removed via an etch-back process. In this manner, a portion of the first photosensitive film pattern 400a at the other part (i.e., the wire part) is also removed, and, thereby, forms a second photosensitive film pattern 400b, in which the width of the first photosensitive film pattern 400a is decreased to form the second photosensitive film pattern 400b.

In exemplary embodiments, the first metal pattern 174 and the blocking pattern 167 are etched using the second photosensitive film pattern 400b as a mask to fabricate the buffer layers 163 and 165, the source electrode 173, and the drain electrode 175, as seen in FIG. 2. In this manner, a second etching solution is used and the second etching solution may simultaneously etch the exposed portion of the first metal pattern 174 including, for example, copper or copper and manganese, and the underlying blocking pattern 167 including, for instance, the gallium zinc oxide (GZO) doped with tin (Sn) or tin oxide (SnOx, where X=1 to 2). The second etching solution may include any suitable etching solution, such as, for example, 5-Aminotetrazole, etc.

It is noted that when the second etching solution includes 5-Aminotetrazole and metal including copper (Cu) or copper (Cu) and manganese (Mn) and an oxide including gallium zinc oxide (GZO) are etch, these materials may be etched at different rates. That is, the rate of etching the metal including copper (Cu) or copper (Cu) and manganese (Mn) may be relatively faster than the rate of etching the oxide including the gallium zinc oxide (GZO). In this manner, a blocking pattern 167 including gallium zinc oxide (GZO) may be over-etched. When the blocking pattern 167 is over-etched, the first metal pattern 174 disposed thereon may be floated, and, as a result, the data line 171, the source electrode 173, and the drain electrode 175 may be floated.

According to exemplary embodiments, however, the buffer layers 163 and 165 are made of, for instance, the gallium zinc oxide (GZO) doped with tin (Sn) or tin oxide (SnOx, where X=1 to 2). Tin (Sn) may not be etched by nitric acid (NHO$_3$).

In this manner, when etching with the second etching solution including 5-Aminotetrazole, the rate of etching the blocking pattern 167 may be decreased. As such, the data line 171, the source electrode 173, and the drain electrode 175 formed on the blocking pattern 167 may be prevented (or otherwise reduced) from being floated because the blocking pattern 167 is prevented (or otherwise reduced) from being over-etched. That is, according to exemplary embodiments, the blocking film 160 (from which the buffer layers 163 and 165 are formed) includes gallium zinc oxide (GZO) doped with tin (Sn) or tin oxide (SnOx, where X=1 to 2), and the weight percent of the tin (Sn) or tin oxide (SnOx, where X=1 to 2) in the blocking film 160 is more than approximately 0% and equal to or less than approximately 20%. This enables the metal layer 170 (from which the source electrode 173 and the drain electrode 175 are formed), the blocking film 160, and the semiconductor layer 150 including the oxide-based material to be etched using the first etching solution, as well as etched in a manner that prevents (or otherwise reduces) the potential for over-etching of the blocking pattern 167 when the metal pattern 174 and the blocking pattern 167 are etched using the second etching solution.

After the formation of the buffer layers 163 and 165, the source electrode 173, and the drain electrode 175, the second photosensitive film pattern 400b is removed.

Adverting to FIGS. 8 and 9, the passivation layer 180 is deposited on the data line 171 and the thin film transistor including the gate electrode 124, the source electrode 173, and the drain electrode 175. To this end, a contact hole 185 exposing the drain electrode 175 is formed in the passivation layer 180.

As illustrated in FIGS. 1 and 2, a metal layer is deposited and subjected to photolithography (or any other suitable patterning process) to form the pixel electrode 191 connected to the drain electrode 175 via the contact hole 185.

According to exemplary embodiments, the blocking film 160 (from which the buffer layers 163 and 165 are formed) includes gallium zinc oxide (GZO) doped with tin (Sn) or tin oxide (SnOx, where X=1 to 2), and the weight percent of tin (Sn) or tin oxide (SnOx, where X=1 to 2) is more than approximately 0% and equal to or less than approximately 20%. In this manner, when the metal layer 170 (from which the source electrode 173 and the drain electrode 175 are formed), the blocking film 160, and the semiconductor layer 150 including the oxide-based material are etched using the first etching solution, and then the metal pattern 174 and the blocking pattern 167 are etched using the second etching solution, the blocking pattern is prevented (or otherwise reduced) from being over-etched.

According to exemplary embodiments, while the gate electrode 124 is shown disposed below the semiconductor 154, it is contemplated that the gate electrode 124 may be disposed on the semiconductor 154 with the semiconductor being disposed between the gate electrode 124 and the insulation substrate 110.

Figure 10:
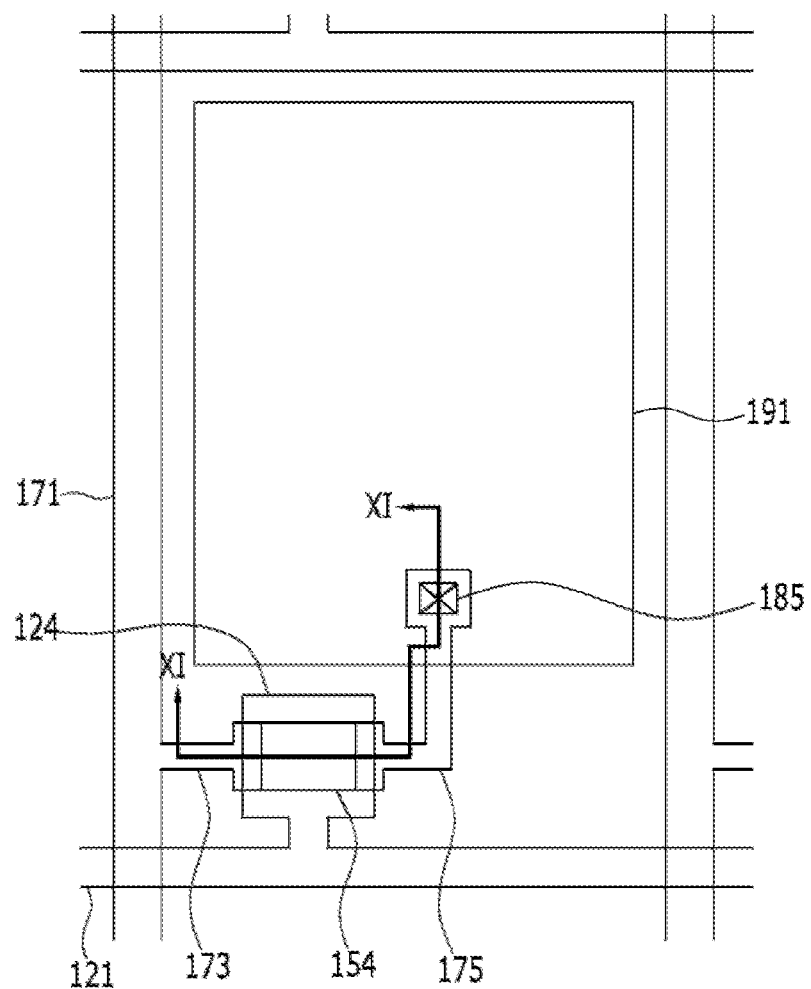
FIG. 10 is a layout view of a pixel of a thin film transistor array panel, according to exemplary embodiments.
Figure 11:
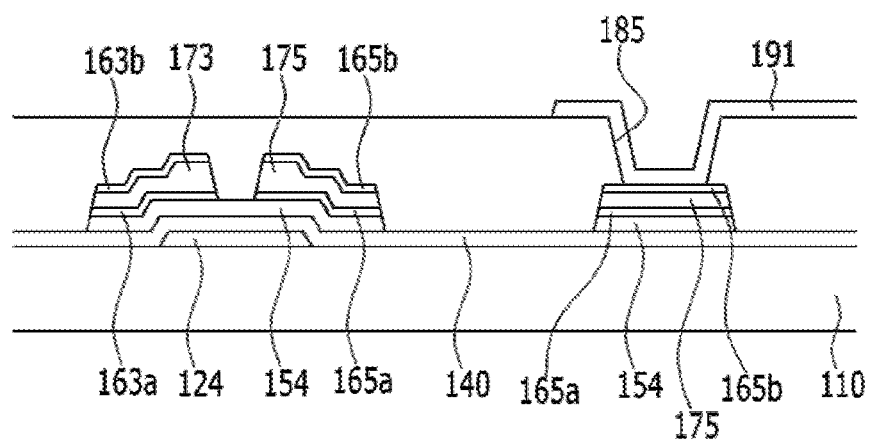
FIG. 11 is a cross-sectional view of the thin film transistor array panel of FIG. 10 taken along sectional line XI-XI, according to exemplary embodiments.

FIG. 10 is a layout view of a pixel of a thin film transistor array panel, according to exemplary embodiments. FIG. 11 is a cross-sectional view of the thin film transistor array panel of FIG. 10 taken along sectional line XI-XI.

Referring to FIGS. 10 and 11, the thin film transistor array panel is substantially similar to the thin film transistor array panel described in association with FIGS. 1 and 2. Therefore, to avoid obscuring exemplary embodiments described herein, duplicative descriptions will be omitted.

Referring to FIGS. 10 and 11, the gate line 121 including the gate electrode 124 is formed on the insulation substrate 110, and the gate insulating layer 140 is disposed on the gate electrode 124.

According to exemplary embodiments, the semiconductor 154 is disposed on the gate insulating layer 140. The semiconductor 154 may be an oxide semiconductor. To this end, the semiconductor layer 150 may include an oxide-based material, such as an oxide based on zinc (Zn), gallium (Ga), tin (Sn), and/or indium (In). For instance, the semiconductor 154 may include zinc oxide (ZnO), indium-gallium-zinc oxide (InGaZnO$_4$), indium-zinc-oxide (Zn—In-Oxide), zinc-tin oxide (Zn—Sn-Oxide), etc. In this manner, the semiconductor 154 including the oxide-based material may be formed via any suitable process(es), such as, for example, a solution-based process, e.g., an inkjet process, and/or the like. As other examples, the semiconductor 154 may be an oxide semiconductor, such as a gallium indium zinc oxide (GIZO) semiconductor, zinc tin oxide (ZTO or ZnSnO) semiconductor, indium zinc oxide (IZO or InZnO) semiconductor, indium zinc tin oxide (IZTO or InZnSnO), and/or the like.

According to exemplary embodiments, first buffer layers 163a and 165b are formed on the semiconductor 154. The first buffer layers 163a and 165b may include, for instance, gallium zinc oxide (GZO) doped with tin (Sn) or tin oxide (SnOx, where X=1 to 2). In this manner, the weight percent of tin (Sn) or tin oxide (SnOx, where X=1 to 2) in the first buffer layers 163a and 165b may be more than approximately 0% and equal to or less than approximately 20%. To this end, the data line 171, the source electrode 173, and the drain electrode 175 are formed on the first buffer layers 163a and 165a.

In exemplary embodiments, the first buffer layers 163a and 165a may improve contact characteristics between the semiconductor 154 (which may be made of an oxide-based material) and the data line 171, the source electrode 173, and the drain electrode 175, as well as configured to prevent (or otherwise reduce) a metallic component from the data line 171, the source electrode 173, and/or the drain electrode 175 from spreading (or otherwise migrating) to the semiconductor 154.

As seen in FIG. 11, the thin film transistor array panel also includes second buffer layers 163b and 165b disposed on the data line 171, the source electrode 173, and the drain electrode 175, unlike the thin film transistor array panel illustrated in FIG. 2. Edges of the first buffer layers 163a and 165a and the second buffer layers 163b and 165b may be substantially the same as the edges of the data line 171, the source electrode 173, and the drain electrode 175 in a plan view. In this manner, an undercut may not occur at the edges of the first buffer layers 163a and 165a and the second buffer layers 163b and 165b as compared to the edges of the data line 171, the source electrode 173, and the drain electrode 175. The second buffer layers 163b and 165b may protect the data line 171, the source electrode 173, and the drain electrode 175.

It is noted that the thin film transistor array panel of FIGS. 10 and 11 may be manufactured in a substantially similar manner as the thin film transistor array panel of FIGS. 1 and 2. As such, FIGS. 3-9 and the associated descriptions are applicable to the fabrication of the thin film transistor array panel of FIGS. 10 and 11. It is noted, however, that, in association with FIG. 7C, a second blocking layer (not shown) would be deposited on the metal film 170. This second blocking layer would be subsequently etched in association with the above-noted etching processes using the first and second etching solutions.

Figure 12:
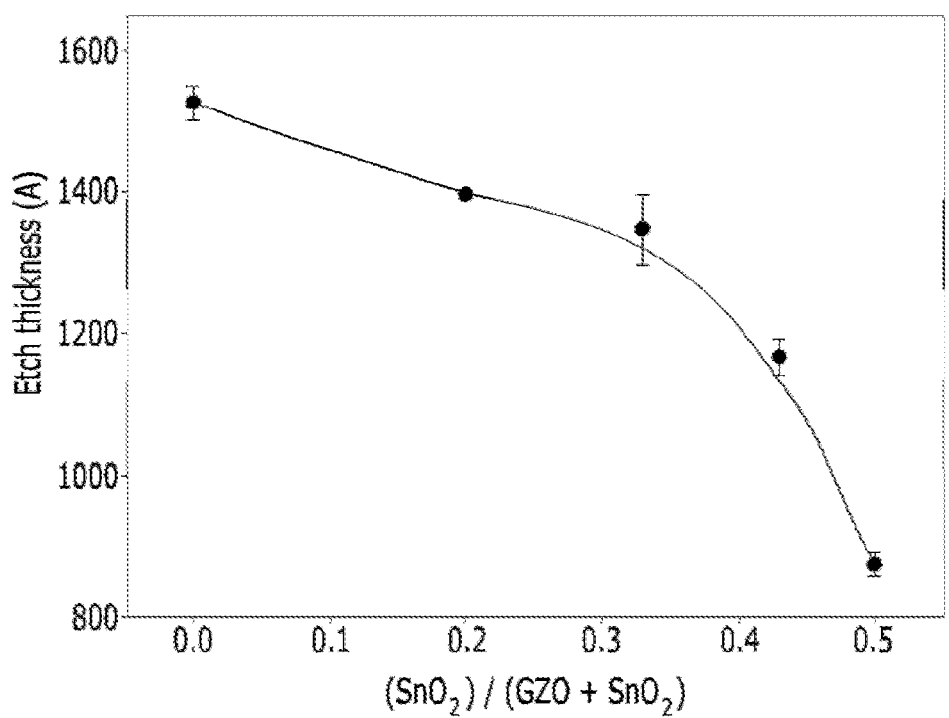
FIG. 12 is a graph comparing etch depths with ratios of tin oxide in a buffer layer of a thin film transistor array panel, according to exemplary embodiments.
Figure 13:
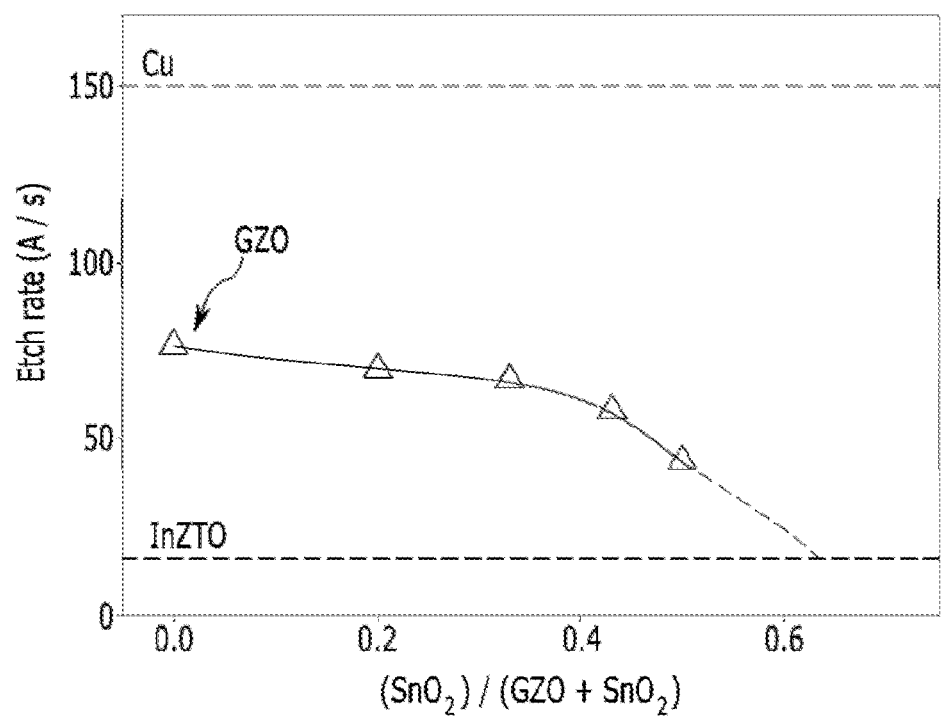
FIG. 13 is a graph comparing etch rates with ratios of tin oxide in a buffer layer of a thin film transistor array panel, according to exemplary embodiments.

FIG. 12 is a graph comparing etch depths with ratios of tin oxide in a buffer layer of a thin film transistor array panel, according to exemplary embodiments. FIG. 13 is a graph comparing etch rates with ratios of tin oxide in a buffer layer of a thin film transistor array panel, according to exemplary embodiments.

In the various experimental examples of FIG. 12, when gallium zinc oxide (GZO) doped with the different levels of tin oxide (SnO$_2$) are etched using the first etching solution including hydrofluoride and ammonium fluoride (NH$_4$F), resulting etch depths are illustrated in FIG. 12. As seen in FIG. 12, as the ratio of tin oxide (SnO$_2$) increases, the etch depth decreases at an increasing rate. Further, when various oxide semiconductors composed of copper (Cu), gallium zinc oxide (GZO) doped with different ratios of tin oxide (SnO$_2$), and indium zinc tin oxide (IZTO) are etched using the second etching solution including 5-Aminotetrazole, resulting etch rates are illustrated in FIG. 13. As seen in FIG. 13, as the ratio of tin oxide (SnO$_2$) increases, the rate of etching decreases at an increasing rate.

Referring to FIGS. 12 and 13, as the ratio of tin oxide (SnO$_2$) in gallium zinc oxide (GZO) doped with tin oxide (SnO$_2$) increases, the etching amount and the rate of etching of the tin oxide (SnO$_2$) in the gallium zinc oxide (GZO) doped with the tin oxide (SnO$_2$) decreases at an increasing rate. According to exemplary embodiments, the buffer layers 163 and 165 include gallium zinc oxide doped with tin (Sn) or tin oxide (SnOx, where X=1 to 2), and the weight percent of tin (Sn) or tin oxide (SnOx, where X=1 to 2) may be more than approximately 0% and equal to or less than approximately 20%. In this manner, the gallium zinc oxide (GZO) doped with tin (Sn) or tin oxide (SnOx, where X=1 to 2) forming the buffer layers 163 and 165 may be etched using the first etching solution and the second etching solution without undercutting or over-etching the buffer layers 163 and 165.

Figure 14:
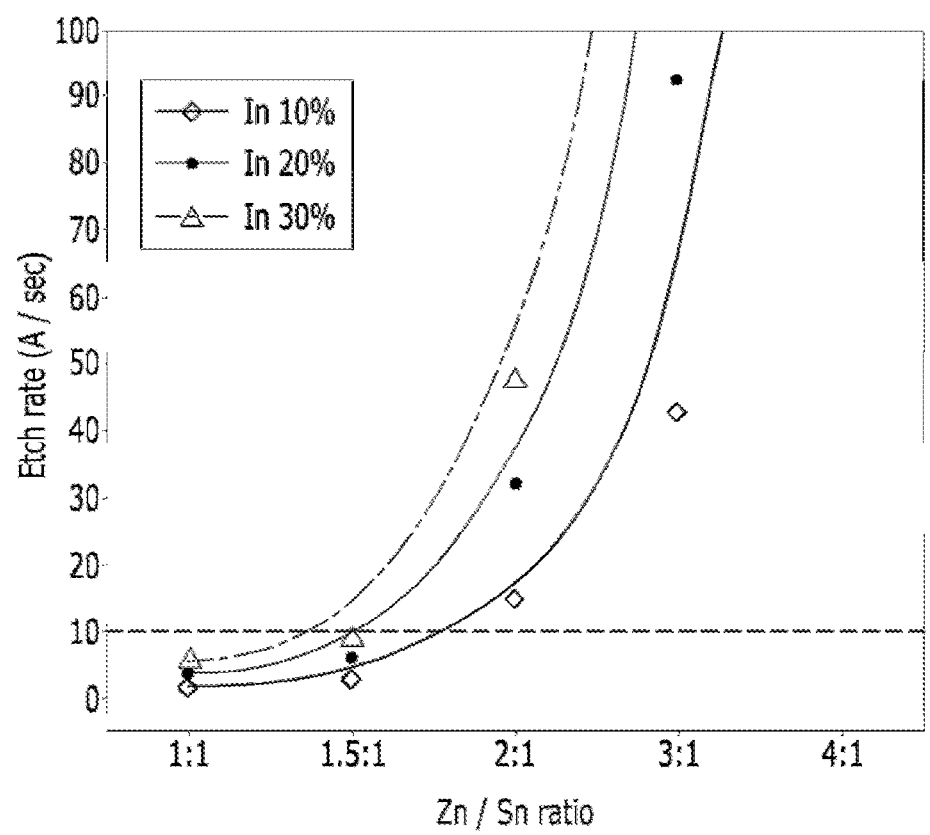
FIG. 14 is a graph comparing etch rates, according to exemplary embodiments.

FIG. 14 is a graph comparing etch rates, according to exemplary embodiments.

In the experimental examples of FIG. 14, the semiconductor 154 includes indium zinc tin oxide (IZTO) and the concentration of tin (Sn) was varied to affect the zinc (Zn) to tin (Sn) ratio, as well as the weight percent of indium (In). In this manner, the various etching rates correspond to etching processes using the second etching solution including 5-Aminotetrazole. As seen in FIG. 14, when the oxide semiconductor is etched using the second etching solution, then as the amount of tin (Sn) increases, the rate of etching decreases, and as the amount of tin (Sn) decreases, the rate of etching rapidly increases. In other words, as the amount of tin (Sn) decreases, the rate of etching exponentially increases.

Another experiment was performed in which gallium zinc oxide (GZO) doped with tin (Sn) was etched using the first etching solution and the second etching solution. In this manner, the rate of etching was measured in association with various amounts (e.g., weight percent) of the doped tin (Sn). The results are provided in Table 1 shown below.

TABLE 1

| Etching Solution | Weight Percent of Tin (%) | | | | |
| --- | --- | --- | --- | --- | --- |
| | 0 | 20 | 40 | 60 | 80 |
| First Etching Solution | Etch Rate 76 (Å/s) | Etch Rate 70 (Å/s) | Etch Rate 67 (Å/s) | Etch Rate 58 (Å/s) | Etch Rate 43 (Å/s) |
| Second Etching Solution | Etch Rate 200 (Å/s) | Not etched | Not etched | Not etched | Not etched |

Referring to Table 1, when the amount of the doped tin (Sn) has a value of approximately 70% or less, the etching speed is not significantly changed. As a result, etching is well achieved when etching the gallium zinc oxide (GZO) doped with tin (Sn) using the first etching solution.

When the GZO is not doped with tin (Sn), the etching speed of the gallium zinc oxide (GZO) is relatively much higher, when the gallium zinc oxide (GZO) is then etched using the second etching solution. When the weight percent of tin (Sn) is more than 20%, the gallium zinc oxide is not etched by the second etching solution. According to exemplary embodiments, the weight percent of tin (Sn) in the buffer layer is more than approximately 0% and equal to or less than approximately 20%, and, as such, the gallium zinc oxide may be etched by the second etching solution.

According to exemplary embodiments, the buffer layers 163 and 165 include gallium zinc oxide (GZO) doped with tin (Sn) or tin oxide (SnOx, where X=1 to 2), and the weight percent of tin (Sn) or tin oxide (SnOx, where X=1 to 2) may be more than approximately 0% and equal to or less than approximately 20%. In this manner, the buffer layers 163 and 165 may be etched by the first etching solution and the second etching solution, and over-etching of the buffer layers 163 and 165 may be prevented (or otherwise reduced).

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A thin film transistor array panel, comprising:
   a gate electrode disposed on a substrate;
   an oxide semiconductor disposed on the substrate and overlapping the gate electrode;
   an insulating layer disposed between the gate electrode and the oxide semiconductor;
   a source electrode overlapping a portion of the oxide semiconductor;
   a drain electrode overlapping another portion of the oxide semiconductor; and
   a buffer layer disposed between the oxide semiconductor and the source electrode and between the oxide semiconductor and the drain electrode,
   wherein the buffer layer comprises tin (Sn) as a doping material, and
   wherein a weight percent of the doping material is greater than approximately 0% and less than or equal to approximately 20%.

2. The thin film transistor array panel of claim 1, wherein:
   an edge of the buffer layer is not undercut as compared to respective edges of the source electrode and the drain electrode.

3. The thin film transistor array panel of claim 2, wherein:
   each of the source electrode and the drain electrode comprise a first surface adjacent to the oxide semiconductor and a second surface opposite the first surface;
   the buffer layer is disposed between the oxide semiconductor and the respective first surfaces of the source electrode and the drain electrode; and
   another buffer layer is disposed on the respective second surfaces of the source electrode and the drain electrode.

4. The thin film transistor array panel of claim 3, wherein:
   the buffer layer comprises gallium zinc oxide (GZO) doped with tin (Sn) or tin oxide (SnOx, where X=1 to 2).

5. The thin film transistor array panel of claim 4, wherein:
   the oxide semiconductor layer comprises gallium indium zinc oxide (GIZO).

6. The thin film transistor array panel of claim 5, wherein:
   each of the source electrode and the drain electrode comprises copper (Cu).

7. The thin film transistor array panel of claim 6, wherein:
   each of the source electrode and the drain electrode comprises a lower layer and an upper layer; and
   the respective lower layers comprise copper (Cu) and the respective upper layers comprise copper (Cu) and manganese (Mn).

8. The thin film transistor array panel of claim 1, wherein:
   each of the source electrode and the drain electrode comprises a first surface adjacent to the oxide semiconductor and a second surface opposite the first surface;
   the buffer layer is disposed between the oxide semiconductor and the respective first surfaces of the source electrode and the drain electrode; and
   another buffer layer is disposed on the respective second surfaces of the source electrode and the drain electrode.

9. The thin film transistor array panel of claim 8, wherein:
   the buffer layer comprises gallium zinc oxide (GZO) doped with tin (Sn) or tin oxide (SnOx, where X=1 to 2).

10. The thin film transistor array panel of claim 9, wherein:
    the oxide semiconductor layer comprises gallium indium zinc oxide (GIZO).

11. The thin film transistor array panel of claim 10, wherein:
    each of the source electrode and the drain electrode comprises copper (Cu).

12. The thin film transistor array panel of claim 11, wherein:
    each of the source electrode and the drain electrode comprises a lower layer and an upper layer; and
    the respective lower layers comprise copper (Cu) and the respective upper layers comprise copper (Cu) and manganese (Mn).

13. The thin film transistor array panel of claim 1, wherein:
    the buffer layer comprises gallium zinc oxide (GZO) doped with tin (Sn) or tin oxide (SnOx, where X=1 to 2).

14. The thin film transistor array panel of claim 13, wherein:
    the oxide semiconductor layer comprises gallium indium zinc oxide (GIZO).

15. The thin film transistor array panel of claim 14, wherein:
    each of the source electrode and the drain electrode comprises copper (Cu).

16. The thin film transistor array panel of claim 15, wherein:
    each of the source electrode and the drain electrode comprises a lower layer and an upper layer; and
    the respective lower layers comprise copper (Cu) and the respective upper layers comprise copper (Cu) and manganese (Mn).

17. The thin film transistor array panel of claim 1, wherein:
    the oxide semiconductor layer comprises gallium indium zinc oxide (GIZO).

18. The thin film transistor array panel of claim 17, wherein:
    each of the source electrode and the drain electrode comprises copper (Cu).

19. The thin film transistor array panel of claim 18, wherein:
    each of the source electrode and the drain electrode comprises a lower layer and an upper layer; and
    the respective lower layers comprise copper (Cu) and the respective upper layers comprise copper (Cu) and manganese (Mn).

20. The thin film transistor array panel of claim 1, wherein:
    each of the source electrode and the drain electrode comprises copper (Cu).

21. The thin film transistor array panel of claim 20, wherein:
each of the source electrode and the drain electrode comprises a lower layer and an upper layer; and
the respective lower layers comprise copper (Cu) and the respective upper layers comprise copper (Cu) and manganese (Mn).

22. A method of manufacturing a thin film transistor array panel, comprising:
forming a gate electrode on a substrate;
forming an insulating layer on the gate electrode; and
forming an oxide semiconductor, a buffer layer, a source electrode, and a drain electrode on the gate insulating layer,
wherein forming the oxide semiconductor, the buffer layer, the source electrode, and the drain electrode comprises:
depositing an oxide semiconductor layer on the insulating layer,
depositing a blocking film on the oxide semiconductor layer,
depositing a metal layer on the blocking film,
forming a first photosensitive film pattern comprising different thicknesses on the metal layer,
etching, using the first photosensitive film pattern as a first mask, the metal layer, the blocking film, and the semiconductor layer using a first etching solution,
forming a second photosensitive film pattern from the first photosensitive film pattern, and
etching, using the second photosensitive film pattern as a second mask, the etched metal layer and the etched blocking film using a second etching solution to form the source electrode, the drain electrode, and the buffer layer, and to expose a channel region of the oxide semiconductor,
wherein the buffer layer comprises tin (Sn) as a doping material, and
wherein a weight percent of the doping material is greater than approximately 0% and less than or equal to approximately 20%.

23. The method of claim 22, wherein:
the first etching solution comprises hydrofluoride and ammonium fluoride; and
the second etching solution comprises 5-aminotetrazole.

24. The method of claim 23, wherein:
an edge of the blocking film is not undercut as compared to an edge of the metal layer when the metal layer and the blocking film are etched using the second etching solution.

25. The method of claim 24, further comprising:
depositing a second blocking film on the metal layer,
wherein the second blocking film is etched when using the first and second etching solutions to form a second buffer layer disposed on the source electrode and the drain electrode, the second buffer layer comprising tin (Sn) as a doping material, and
wherein the weight percentage of the doping material in the second buffer layer is greater than approximately 0% and less than or equal to approximately 20%.

26. The method of claim 25, wherein:
the buffer layer comprises gallium zinc oxide (GZO) doped with tin (Sn) or tin oxide (SnOx, where X=1 to 2).

27. The method of claim 26, wherein:
the oxide semiconductor layer comprises gallium indium zinc oxide (GIZO).

28. The method of claim 27, wherein:
each of the source electrode and the drain electrode comprises copper (Cu).

29. The method of claim 22, wherein:
an edge of the blocking film is not undercut as compared to an edge of the metal layer when the metal layer and the blocking film are etched using the second etching solution.

30. The method of claim 29, further comprising:
depositing a second blocking film on the metal layer,
wherein the second blocking film is etched when using the first and second etching solutions to form a second buffer layer disposed on the source electrode and the drain electrode, the second buffer layer comprising tin (Sn) as a doping material, and
wherein the weight percentage of the doping material in the second buffer layer is greater than approximately 0% and less than or equal to approximately 20%.

31. The method of claim 30, wherein:
the buffer layer comprises gallium zinc oxide (GZO) doped with tin (Sn) or tin oxide (SnOx, where X=1 to 2).

32. The method of claim 31, wherein:
the oxide semiconductor layer comprises gallium indium zinc oxide (GIZO).

33. The method of claim 32, wherein:
each of the source electrode and the drain electrode comprises copper (Cu).

34. The method of claim 22, further comprising:
depositing a second blocking film on the metal layer,
wherein the second blocking film is etched when using the first and second etching solutions to form a second buffer layer disposed on the source electrode and the drain electrode, the second buffer layer comprising tin (Sn) as a doping material, and
wherein the weight percentage of the doping material in the second buffer layer is greater than approximately 0% and less than or equal to approximately 20%.

35. The method of claim 34, wherein:
the buffer layer comprises gallium zinc oxide (GZO) doped with tin (Sn) or tin oxide (SnOx, where X=1 to 2).

36. The method of claim 35, wherein:
the oxide semiconductor layer comprises gallium indium zinc oxide (GIZO).

37. The method of claim 36, wherein:
each of the source electrode and the drain electrode comprises copper (Cu).

38. The method of claim 22, wherein:
the buffer layer comprises gallium zinc oxide (GZO) doped with tin (Sn) or tin oxide (SnOx, where X=1 to 2).

39. The method of claim 38, wherein:
the oxide semiconductor layer comprises gallium indium zinc oxide (GIZO).

40. The method of claim 39, wherein:
each of the source electrode and the drain electrode comprises copper (Cu).

41. The method of claim 22, wherein:
the oxide semiconductor layer comprises gallium indium zinc oxide (GIZO).

42. The method of claim 41, wherein:
each of the source electrode and the drain electrode comprises copper (Cu).

43. The method of claim 22, wherein:
each of the source electrode and the drain electrode comprises copper (Cu).

* * * * *